(12) United States Patent
Yu (10) Patent No.: US 7,024,934 B2
(45) Date of Patent: Apr. 11, 2006

(54) VIBRATING BEAM ACCELEROMETER

(75) Inventor: Lianzhong Yu, Redmond, WA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 11/084,949

(22) Filed: Mar. 21, 2005

(65) Prior Publication Data

US 2005/0160816 A1    Jul. 28, 2005

Related U.S. Application Data

(62) Division of application No. 10/698,214, filed on Oct. 31, 2003, now Pat. No. 6,938,334.

(51) Int. Cl.
G01P 15/10 (2006.01)

(52) U.S. Cl. .............................. 73/514.37; 73/514.29; 73/862.59

(58) Field of Classification Search ............ 73/514.29, 73/862.59, 514.16, 514.36, 514.01, 514.37, 73/702, 704
See application file for complete search history.

(56) References Cited

U.S. PATENT DOCUMENTS

| | | | |
|---|---|---|---|
| 3,214,827 A | 11/1965 | Prohofsky | |
| 4,372,173 A | 2/1983 | EerNisse et al. | |
| 4,939,935 A * | 7/1990 | Amand | 73/514.29 |
| 4,945,765 A | 8/1990 | Roszhart | |
| 5,006,487 A | 4/1991 | Stokes | |
| 5,165,279 A * | 11/1992 | Norling et al. | 73/514.14 |
| 5,236,118 A | 8/1993 | Bower et al. | |
| 5,367,217 A | 11/1994 | Norling | |
| 5,501,103 A | 3/1996 | Woodruff et al. | |
| 5,545,283 A | 8/1996 | Collins et al. | |
| 5,594,170 A | 1/1997 | Peters | |
| 5,655,290 A | 8/1997 | Moresco et al. | |
| 5,918,139 A | 6/1999 | Mitani et al. | |
| 5,948,981 A * | 9/1999 | Woodruff | 73/514.29 |
| 6,004,866 A | 12/1999 | Nakano et al. | |
| 6,475,072 B1 | 11/2002 | Canaperi et al. | |
| 6,484,578 B1 | 11/2002 | Woodruff et al. | |
| 6,484,579 B1 | 11/2002 | Collins | |
| 6,662,655 B1 * | 12/2003 | Foote | 73/493 |
| 6,745,627 B1 * | 6/2004 | Woodruff et al. | 73/514.29 |

* cited by examiner

*Primary Examiner*—Helen Kwok
(74) *Attorney, Agent, or Firm*—Charles J. Rupnick (57) ABSTRACT

Microelectromechanical system (MEMS) integrated micro devices and acceleration sensor devices formed of first and second silicon wafers that are permanently joined together in a composite silicon wafer having an array of first complete stand-alone three-dimensional micromechanical device features formed in the first silicon wafer, an array of second complete stand-alone three-dimensional micromechanical device features formed in the second silicon wafer, and one or more composite three-dimensional micromechanical device features formed of first partial three-dimensional micromechanical device features formed in the first silicon wafer that are permanently joined to cooperating second partial three-dimensional micromechanical device features formed in the second silicon wafer.

20 Claims, 6 Drawing Sheets

VIBRATING BEAM ACCELEROMETER

This application claims priority benefit of parent U.S. patent application Ser. No. 10/698,214 filed in the name of Lianzhong Yu on Oct. 31, 2003 now U.S. Pat. No. 6,938,334, the complete disclosure of which is incorporated herein by reference.

FIELD OF THE INVENTION

The present invention relates to micromachined accelerometer devices and methods, and in particular to double-sided accelerometer devices using high resolution vibratory resonators and methods for manufacturing the same.

BACKGROUND OF THE INVENTION

As described by Norling in U.S. Pat. No. 5,367,217, FOUR BAR RESONATING FORCE TRANSDUCER," the complete disclosure of which is incorporated herein by reference, two- and four-bar vibrating beam force sensing elements have been used as vibratory resonators in crystal-controlled oscillators and are generally known in the art. Such force sensing elements have been known to be used in various transducers to measure various parameters, including acceleration, force, temperature, pressure and weight. In particular, such vibrating beam force sensing elements are responsive to forces, such as longitudinal or axial forces, which cause a variation of the frequency of vibration of the beams that, in turn, cause a variation in an output frequency of the oscillator which can be used as a measure of the applied force.

In U.S. Pat. No. 5,501,103, "TWO-PORT ELECTROMAGNETIC DRIVE FOR A DOUBLE-ENDED TUNING FORK," the complete disclosure of which is incorporated herein by reference, Woodruff, et al. describes a vibrating beam accelerometer which includes two- and four-bar electromagnetically excited double-ended tuning forks (DETF) of the type described by Norling. As described by Woodruff, et al., vibrating beam accelerometers are generally known in the art. The DETF of Woodruff is formed with separate conducting paths for the drive circuit and pick-off circuit that minimize problems associated with vibrating beam accelerometers formed with a single conducting path resulting from variations of the resistance path due to manufacturing tolerances and temperature changes.

Figure 1:
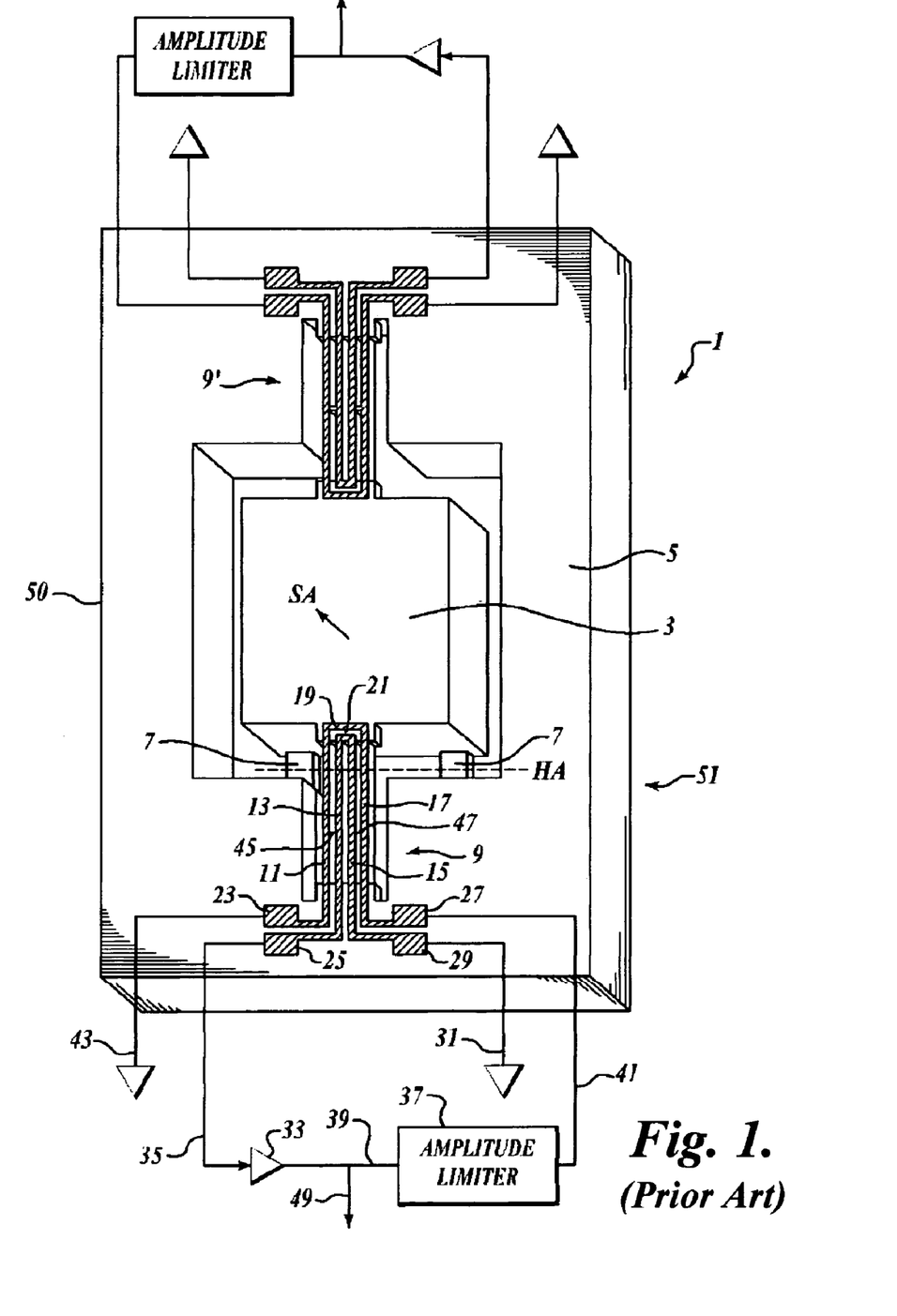
FIG. 1 illustrates one example of a known vibrating beam accelerometer.

FIG. 1 illustrates one example of a known vibrating beam accelerometer 1. Such known vibrating beam accelerometers normally include a pendulum or proof mass 3, connected to a frame 5 by way of a pair of flexures 7 to enable the proof mass 3 to rotate about a hinge axis HA, defined by the flexures 7. A double-ended tuning fork (DETF) having two or four vibrating beams is connected between the frame 5 and the proof mass 3, perpendicular to the hinge axis HA to define a sensitive axis SA. In the example of FIG. 1, a DETF 9 having four vibrating beams 11, 13, 15 and 17 is connected between the frame 5 and the proof mass 3. Excitation is applied to the DETF 9 to cause the vibrating beams 11, 13, 15 and 17 to vibrate at a resonant frequency when the proof mass 3 is at rest. Forces applied along the sensitive axis SA apply either tension or compression forces the vibrating beams 11, 13, 15 and 17 which changes their resonant frequency. This change in frequency, in turn, is a measure of the force applied along the sensitive axis SA.

Various types of excitation are known to force the vibrating beams 11, 13, 15 and 17 to vibrate, such as electromagnetic, electrostatic, and thermal excitation. The type of excitation depends on the particular materials used for construction. For example, crystalline quartz DETFs are excited according to the piezoelectric property of the quartz. Silicon DETFs are normally micromachined and are excited by other means, such as electrostatically or electromagnetically.

FIG. 1 illustrates an exemplary silicon micromachined vibrating beam accelerometer that includes a four-beam double-ended tuning fork that is adapted to be excited electromagnetically. In such an embodiment, the outer pair of vibrating beams 11 and 17 are electrically connected together by a conducting member 19. The inner pair of vibrating beams 13 and 15 is connected together by a conducting member 21. Free ends of each of the vibrating beams 11, 13, 15 and 17 are connected to wire bond pads 23, 25, 27 and 29. In such an embodiment, a conductive material, such as gold, is applied to the vibrating beams 11, 13, 15 and 17 as well as the wire bond pads 23, 25, 27 and 29 to enable electric current to flow between the wire bond pads 23, 25, 27 and 29 through the respective vibrating beams 11, 13, 15 and 17. Such a configuration provides separate conducting paths between the vibrating beams used for the drive circuit and the vibrating beams used for the pick-off voltage. In particular, a first conducting path is formed between the outer pair of beams 11 and 17, while a second conducting path is provided between the inner pair of tines 13 and 15.

An oscillator circuit is provided to drive the vibrating beams. In particular, the outer pair of vibrating beams 11, 17 are used in the drive circuit, while the inner pair of vibrating beams 13 and 15 are used in the pick-off circuit. Referring first to the drive circuit, the electrode 29 is connected to ground by way of an electrical conductor 31. The other inner vibrating beam 13 is connected to an amplifier 33 by way of an electrical conductor 35 connected to the electrode 25. The output of the amplifier 33 is, in turn, connected to an amplitude limiter 37 by way of an electrical conductor 39. The output of the amplitude limiter 37, in turn, is used to provide an alternating current (AC) drive current of the outer pair of vibrating beams 11, 17. In particular, the output of the amplitude limiter 37 is connected to the electrode 27 by way of an electrical conductor 41. This forces the drive current up the outer beam 17 and down the outer beam 11 to ground. The drive current is then connected to ground by way of the electrical conductor 43. An externally generated magnetic field B is applied in a direction generally perpendicular to the plane of the DETF 9. The magnetic field B having flux lines in a direction generally perpendicular to the plane of the DETF, interacts with the AC drive current in the outer beams 11 and 17 which causes these beams 11, 17 to vibrate. Mechanical couplings between the pair of beams 11 and 13 and between the pair of beams 15 and 17 are provided by respective cross members 45 and 47. More particularly, one cross member 45 is connected between the tine 11 and 13 to cause these beams to vibrate together. The other cross member 47 is connected between the beams 15 and 17 to cause them to vibrate together. Since the cross member 45 is connected between the beams 11 and 13 and the cross member 47 is connected between the beams 15 and 17, all four beams 11, 13, 15 and 17 are mechanically coupled together forming a two degree of freedom mechanical system. These mechanical couplings of the inner pair of beams 13 and 15 relative to the outer pair of beams 11 and 17 cause a voltage to be generated across the inner pair of beams 13 and 15. This voltage is generated across the electrodes 25 and 29. This voltage, known as the pickoff voltage, is then applied to an amplifier 33 by way of a positive feedback loop in order to form an oscillator.

In operation, in response to an excitation or drive current the beams 11, 13, 15 and 17 are forced to vibrate at a resonant frequency while the proof mass 3 is at rest. Force applied to the proof mass 3 along the sensitive axis SA causes the vibrating beams 11, 13, 15 and 17 to undergo either tension or compression which, in turn, causes a variation in the resonant frequency at which the beams 11, 13, 15 and 17 vibrate. This variation in the resonant frequency is useful a measure of the applied force. This frequency can be measured at the output of the amplifier 33 along a signal line 49 by any conventional frequency measuring circuitry which is well known in the art. According to known prior art, the vibrating beam accelerometer device 1 optionally includes a second DETF sensor 9' coupled between the an end of the proof mass 3 and frame 5 opposite from the suspension flexures 7. Such a dual DETF arrangement provides many advantages, such as doubling the output and common mode cancellation of error sources, which is the tracking and mutual cancellation of the common mode responses of two DETFs in a single sensor.

Vibrating beam accelerometer of the type depicted in FIG. 1 have been fabricated from a body of semiconductor material, such as silicon, using micromachining techniques as microelectromechanical systems, or "MEMS," integrated micro devices or systems combining electrical and mechanical components fabricated using integrated circuit (IC) batch processing techniques.

In the most general form, MEMS consist of mechanical microstructures, microsensors, microactuators and electronics integrated in the same environment, i.e., on a silicon chip. MEMS is an enabling technology in the field of solid-state transducers, i.e., sensors and actuators. The microfabrication technology enables fabrication of large arrays of devices, which individually perform simple tasks but in combination can accomplish complicated functions. Current applications include accelerometers, pressure, chemical and flow sensors, micro-optics, optical scanners, and fluid pumps. For example, one micromachining technique involves masking a body of silicon in a desired pattern, and then deep etching the silicon to remove unmasked portions thereof. The resulting free-standing three-dimensional silicon structure functions as a miniature mechanical force sensing device, such as an accelerometer that includes a proof mass suspended by a flexure. Existing techniques for manufacturing these miniature devices are described in U.S. Pat. No. 5,006,487, "Method of Making an Electrostatic Silicon Accelerometer" and U.S. Pat. No. 4,945,765 "SILICON MICROMACHINED ACCELEROMETER," the complete disclosures of which are incorporated herein by reference.

Vibrating beam accelerometer of the type depicted in FIG. 1 have different features provided in the front and back surfaces 50, 51. For example, features of the DETF 9 are provided in the front surface 50 while features of the suspension flexures 7 are formed in the back surface 51. Such two-sided structures have been formed using different techniques with different results. For example, a large array of the moving system (proof mass 3, frame 5, suspension flexures 7, etc.) is fabricated in one wafer substrate while another large array of the DETF sensors 9 is fabricated in a different wafer substrate. The DETF sensors 9 are then attached between proof mass and frame, as by an adhesive or other bonding agent. A vibrating beam accelerometer having such an adhesively bonded DETF sensor is described by Woodruff, et al. in U.S. Pat. No. 6,484,578, "VIBRATING BEAM ACCELEROMETER." While effective for some applications, this bonding of the DETF sensor 9 introduces an area of inherent thermal mismatch that leads to inaccuracies in the sensor output that is unacceptable in high accuracy applications. Furthermore, because the features, particularly the DETF sensors 9, are so small and delicate, adhesive or other bonding of the DETF sensors 9 is not known to be feasible using today's assembly techniques. Rather, the method of forming two-sided structures by adhesive or other bonding of the DETF sensors 9 is currently feasible only in quartz because the structures are larger and stronger than those formed in silicon, and are therefore more easily manipulated.

One effective alternative is fabricating a large array of features in a first side, such as the features of the DETF 9 in the front side 50, of a silicon wafer, then masking these front side features to protect them from further etching, and only then fabricating a matching array of the backside features, such as the suspension flexures 7, in the second side of the wafer. This process of etching the entire array of devices from both sides of the wafer is effective for providing all the device's features integrally in a single substrate without introducing adhesives other bonding agents so that a highly accurate device results. One drawback to such double-sided fabrication is yield which requires high yields of both the first- and second-side features. For example, even masking the first side cannot prevent some damage of the first-side features so that overall yield suffers even more, regardless of the yield of second-side features. Additionally, high yields of the first-side processing requires high yields of the second-side processing as well, else the first-side processing is wasted. In practice, even if the yield of the first-side processing is 70 to 90 percent, if yield of the second-side processing is only 10 percent, the yield for the entire batch is no more than 10 percent. Obviously, a low yield of the first-side results in scrap of the entire batch and second side processing does not occur.

Therefore, a more reliable double-sided fabrication process is desirable.

SUMMARY OF THE INVENTION

According to one aspect of the invention, a composite microelectromechanical system (MEMS) integrated micro acceleration sensor is provided in a substrate having formed therein a proof mass suspended from a frame by a flexure and a vibratory beam coupled between the proof mass and frame, wherein at least one of either the proof mass or the frame is formed of a composite of two or more substrates, and at least one of either the flexure or the vibratory beam is formed complete in a single one of the two or more substrates.

According to another aspect of the invention, the flexure of the acceleration sensor is formed complete in a single one of the two or more substrates.

According to another aspect of the invention, the vibratory beam of the acceleration sensor is formed complete in a single one of the two or more substrates.

According to another aspect of the invention, the flexure is formed complete in a single one of the two or more substrates, and the vibratory beam is formed complete in a different single one of the two or more substrates.

According to another aspect of the invention, both the proof mass and the frame are formed of a composite of two or more substrates.

According to another aspect of the invention, the acceleration sensor includes electrical means for causing the vibratory beam to vibrate at a resonant frequency when the composite proof mass is at rest relative to the composite frame, and also includes electrical means for receiving a signal representative of a variation in the resonant frequency of the vibrating beam as a function of tension or compression forces being applied by movement of the composite proof mass relative to the composite frame.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is a method for fabrication of microelectromechanical systems, or "MEMS," integrated micro devices, including the steps of micromaching a patterned array of first three-dimensional (hereinafter 3-dimensional) micromechanical device features in a first silicon wafer; micromaching a first optical alignment mark on a face of the first wafer relative to the array of first device features; micromaching a patterned array of second 3-dimensional micromechanical device features in a second silicon wafer, the second 3-dimensional micromechanical device features being configured to cooperate with the first 3-dimensional micromechanical device features when joined therewith; micromaching a second optical alignment mark on a face of the second wafer relative to the array of second device features; aligning the first patterned array of device features relative to the second patterned array of device features as a function of aligning the first and second optical alignment marks; permanently joining the first and second arrays of device features into an array of integral devices as a function of permanently joining the first and second silicon wafers into a single composite wafer; and subsequently separating the array of integral devices into individual devices each having a set of the first and second device features.

Additionally, the method of the invention is embodied in a number of the individual micromachined devices formed according to the method of the invention. Accordingly, by example and without limitation, the individual micromachined devices of the invention are embodied in individual micromachined vibrating beam accelerometers fabricated as microelectromechanical systems, or "MEMS," integrated micro devices having a set of 3-dimensional micromechanical device features formed in a first silicon substrate; a second set of 3-dimensional micromechanical device features in a second silicon substrate, the second set of device features being configured to cooperate with the first set of device features when joined therewith; and the first and second silicon substrates being permanently joined with the first and second sets of cooperating features being mutually aligned.

Figure 2:
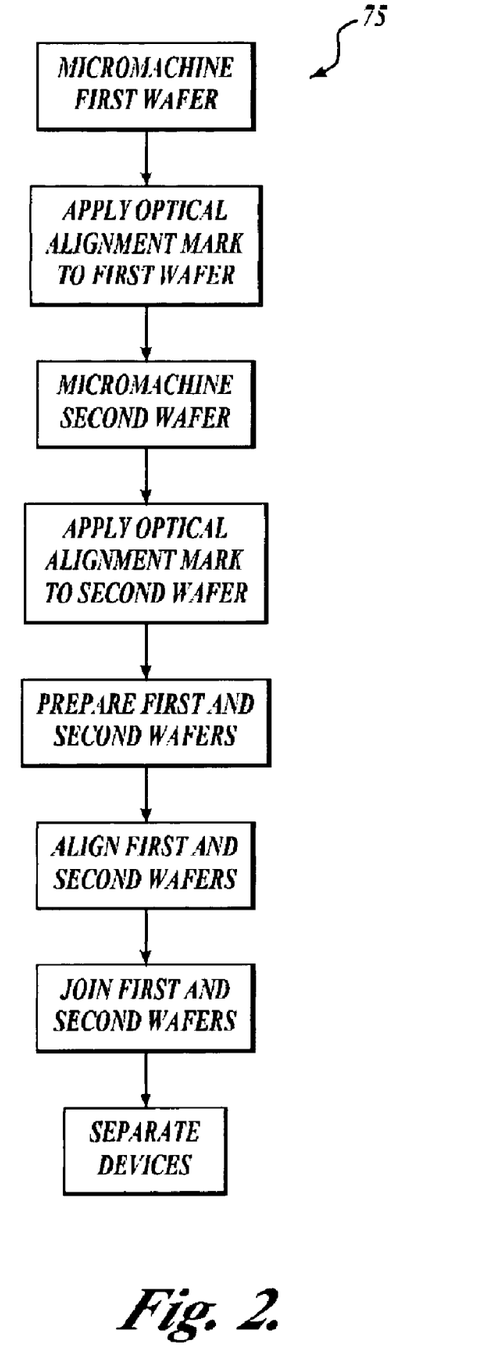
FIG. 2 illustrates the method of the invention embodied in a process flow diagram.

FIG. 2 illustrates the method of the invention embodied in a process flow diagram 75. According to the method of the invention an array of first 3-dimensional micromechanical device features is micromachined in a first silicon wafer, and a first optical alignment mark is micromachined on a face of the first wafer relative to the array of first device features. An array of second 3-dimensional micromechanical device features different from the first device features is micromachined in a second silicon wafer, the second 3-dimensional micromechanical device features being arranged mate with cooperating first 3-dimensional micromechanical device features micromachined in a first silicon wafer and being configured to cooperate with the first 3-dimensional micromechanical device features when joined therewith. A second optical alignment mark is micromachined on a face of the second wafer relative to the array of second device features. The first and second wafers are prepared for wafer-to-wafer alignment and high-temperature silicon fusion bonding in a conventional manner according to one of the methods well-known and accepted in the art.

The first and second arrays of device features are mounted in a conventional align/bond apparatus of a type well-known in the art and aligned as a function of aligning the first and second optical alignment marks. The first and second arrays of device features are thereafter initially temporarily and later permanently joined by a conventional and well-known high-temperature silicon fusion bonding process into an array of integral devices as a function of permanently joining the first and second silicon wafers into a single composite wafer. Using well-known conventional die cutting techniques, the array of integral devices are subsequently separated into individual devices each having the first and second 3-dimensional device features.

According to one embodiment of the invention, the method of the invention is embodied in a pair of wafers having different but cooperating first and second 3-dimensional features that, in composite, form an array of acceleration sensors each having a composite proof mass suspended by integral flexures from a composite frame with one or more integral vibrating beams coupled between the proof mass and frame, electrical signal lines formed on the vibrating beams and leading to one or more wire bond pads formed on a surface of the composite frame, and an oscillation and feed back circuit coupled to the vibrating beams through the wire bond pads and electrical signal lines and interacting with a magnetic field B for exciting the beams to resonance and for receiving a signal representative of a variation in the resonant frequency of the vibrating beams as a function of tension or compression forces being applied by movement of the composite proof mass relative to the composite frame.

Figure 3:
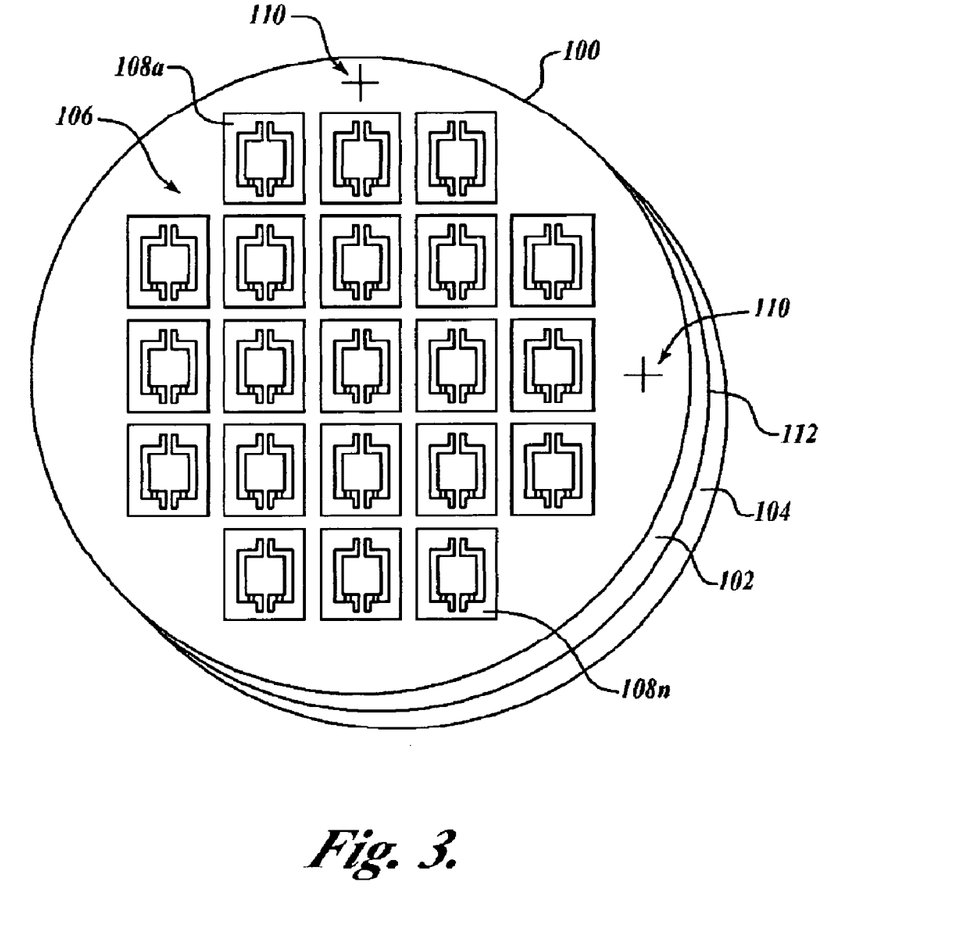
FIG. 3 illustrates the method of the invention embodied in a composite wafer having a large array of composite MEMS devices formed therein.

FIG. 3 illustrates the method of the invention embodied in a composite silicon wafer 100 formed of a pair of silicon wafers 102, 104 shown by example and without limitation as conventional round wafers. Such wafers are also commonly provided in squares. The wafers may be cut to standard round or square dimensions of prescribed thickness, or alternatively, cut to special or proprietary dimensions without affecting practice of the invention as long as a conventional or other wafer align/bond machine can operate with the wafers.

Each of the wafers 102, 104 includes first and second or top and bottom substantially parallel surfaces spaced apart by the thickness of the wafer material, which may be different for each of the two wafers. Preferably, each of the top and bottom surfaces is polished to a prescribed finish, with at least the mating surfaces, i.e., the bottom of the top wafer 102 and the top of the bottom wafer 104, being polished to a degree to accommodate and encourage subsequent silicon fusion bonding.

Arrays of different first and second 3-dimensional micromechanical device features 106 are micromachined in different ones of the pair of silicon wafers 102, 104, such that, when the wafers 102, 104 are joined together into the composite wafer 100, an array of composite devices 108a–108n are provided in the wafer 100. The device features 106 are micromachined using conventional microelectromechanical system, or "MEMS," fabrication techniques, such as etching and laser cutting. The etching is, for example, a conventional reactive ion etching (RIE) or a conventional deep reaction ion etching (DRIE) technique, as are well-known in the art.

In addition to the device features 106, one or more tool marks 110 are provided on one surface of each of the pair of silicon wafers 102, 104 to act as guides for aligning the cooperating features 106 in the different wafers 102, 104 during assembly. The marks 110 are, by example and without limitation, formed by a laser or etch process before, after or simultaneously with the device features 106 and are precisely aligned relative to the features 106. The marks 110 are optical marks visible under magnification, as by use of a microscope, during mounting of the wafers 102, 104 into a chuck or other holding apparatus of a conventional wafer align/bond machine of a type well-known in the art. The marks 110 thus operate in cooperation with the align/bond machine to accurately align device features in the one of the silicon wafers 102 with cooperating features in the other wafer 104 during assembly.

Accordingly, an array of the first 3-dimensional device features 106 are micromachined into a quantity of the first wafers 102, and an array of the different second 3-dimensional device features 106 are micromachined into a quantity of the second wafers 104. Each of the first and second wafers 102, 104 are also provided with the tool marks 110.

Subsequent to micromaching the different arrays of 3-dimensional device features 106 in quantities of the first and second silicon wafers 102, 104, the individual wafers are inspected for quality of the features 106. If the yield is within prescribed minimum limits, for example, a minimum of 70 percent yield of useable features, the individual wafer is accepted for mating with a wafer having an acceptable yield of the cooperating features 106. Mating of a pair of the first and second wafers 102, 104 each having acceptable yields is reasonably expected to produce a composite wafer 100 having an acceptable yield of the composite devices 108a–108n The wafers 102 having the first 3-dimensional micromechanical device features 106 are thereafter interchangeable. The wafers 104 having the second 3-dimensional micromechanical device features 106 are also thereafter interchangeable. This interchangeability eliminates any requirement to further inspect the features 106 or to match specific first wafers 102 with specific second wafers 104. In other words, the selection of matching parts that is so common in high precision micromechanical devices is completely eliminated by the method of the invention.

Any one of the quantity of accepted first wafers 102 with any one of the quantity of accepted second wafers 104 as follows. The surfaces of the two wafers 102, 104 intended for mating are cleaned in a manner expected to produce a silicon fusion bond. See, for example, the cleaning method described by Canaperi, et al. in U.S. Pat. No. 6,475,072, "METHOD OF WAFER SMOOTHING FOR BONDING USING CHEMO-MECHANICAL POLISHING (CMP)," the complete disclosure of which is incorporated herein by reference, which is performed with a down force of 1 psi, a backside air pressure of 0.5 psi, a platen speed of 50 rpm, a carrier speed of 30 rpm and a slurry flow rate of 140 milliliters per minute. Other appropriate cleaning methods are also well-known in the art. For example, the previously polished mating surfaces, i.e., the bottom of the top wafer 102 and the top of the bottom wafer 104, are cleaned and primed to a degree to provide surface sufficient to accommodate and encourage subsequent silicon fusion bonding. The priming process generates a surface rich in OH ions, whereby van der Waals' forces can be used to temporarily join the wafers 102, 104.

The individual cleaned and primed wafers 102, 104 are mounted in the wafer align/bond machine and aligned relative to one another using the one or more optical tool marks 110 provided in each of the wafers. The mutually aligned wafers 102, 104 are brought together under vacuum by the align/bond machine whereupon they are temporarily joined by the van der Waals' interaction.

The temporarily joined wafers 102, 104 are high-temperature annealed in a conventional silicon fusion bonding oven of a type well-known in the art wherein a fusion bond joint 112 is formed between the wafers 102, 104. Upon release from the fusion bonding process, the wafers 102, 104 are fused into a single integral composite wafer 100 having the first and second 3-dimensional micromechanical device features 106 micromachined in the respective first and second sides indicated generally at 102, 104. The individual freestanding composite 3-dimensional micromechanical devices 108a–108n are released from the composite wafer 100 having the first and second 3-dimensional micromechanical device features 106 aligned in a cooperative manner. One such wafer aligning and bonding process is described by Bower, et al. in U.S. Pat. No. 5,236,118, "ALIGNED WAFER BONDING," the complete disclosure of which is incorporated herein by reference, for forming 3-dimensional structures in separate prefabricated layers rather than monolithically in a single layer. Another wafer aligning and bonding apparatus and method is described by Collins, et al. in U.S. Pat. No. 5,545,283, "APPARATUS FOR BONDING WAFER PAIRS," the complete disclosure of which is incorporated herein by reference, having a heated platen surrounded by a pressurization vessel wherein the heated platen includes channels connected to a hole which runs through it. Wafer pairs are placed on the top surface of the platen, a rubber mat is placed over the top of the wafer pairs, and a vacuum is drawn through the hole and the channels. The rubber mat compresses the wafer pairs. The platen is heated for the bonding process. The pressurization chamber is pressurized supplying additional bonding pressure to the wafer pair. Once sufficiently heated, the heated platen is liquid cooled completing the bonding process. Other appropriate wafer aligning and bonding apparatus and methods are also well-known in the art.

Figure 4:
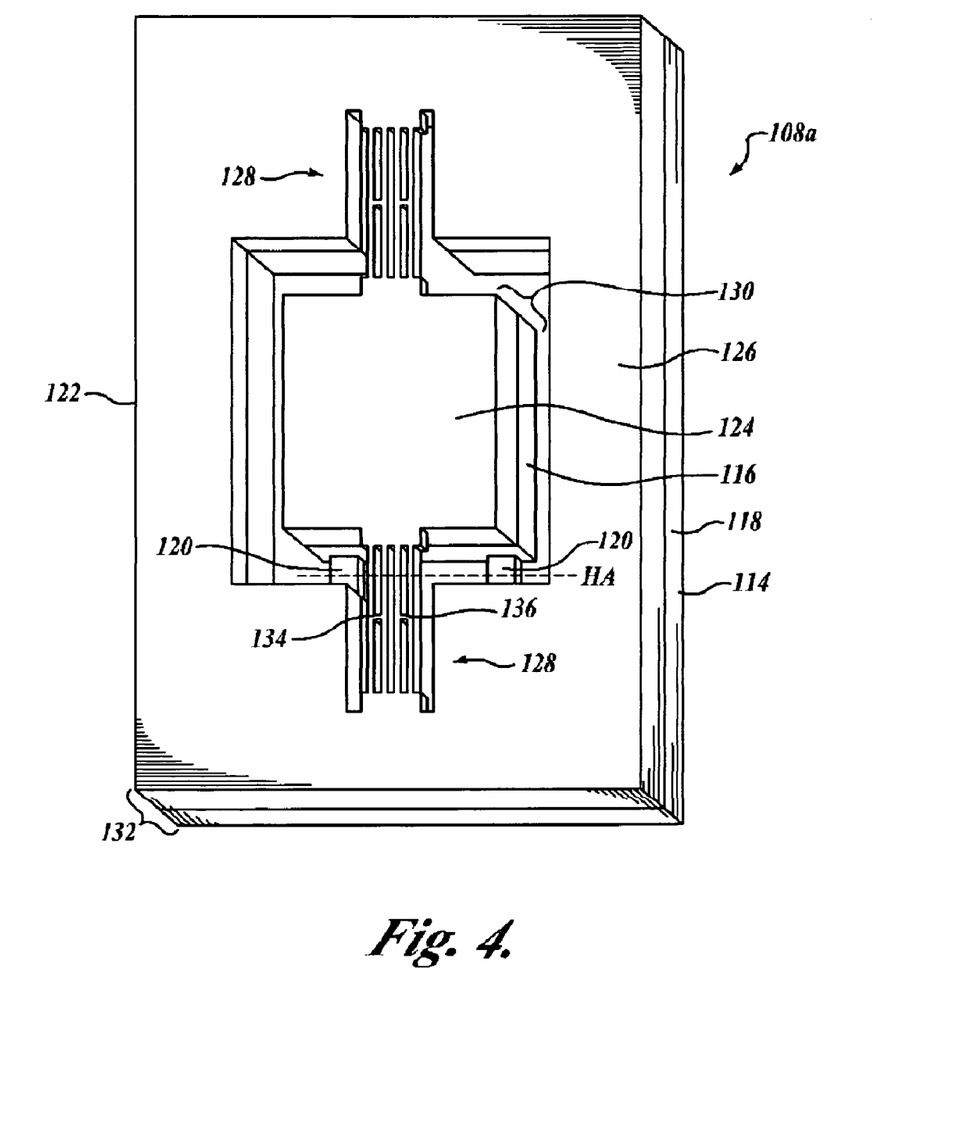
FIG. 4 illustrates the method of the invention embodied in an exemplary composite MEMS device.

FIG. 4 illustrates an exemplary composite device 108a formed using the method of the invention as describe herein. Accordingly, each device 108a includes a first substrate 114 having micromachined therein a first partial pendulum or proof mass 116 connected to a first partial frame 118 by one or more complete stand-alone flexures 120 for translation or rotation about a hinge axis HA defined by the one or more flexures 120. Each device 108a also includes a second substrate 122 having micromachined therein a second partial pendulum or proof mass 124 connected to a second partial frame 126 and one or more complete stand-alone vibrating beams 128 coupled between the second partial proof mass 124 and the second partial frame 126, and wherein the first and second partial proof masses 116 and 124 are permanently joined together, by example and without limitation using high-temperature silicon fusion bonding, into a single composite pendulum or proof mass 130 and the first and second partial frames 118 and 126 are substantially simultaneously permanently joined together into a single composite frame 132 such that the composite proof mass 130 is suspended from the composite frame 132 by the one or more flexures 120 for translation or rotation about the hinge axis HA, and the one or more vibrating beams 128 are coupled between the composite proof mass 130 and the composite frame 132 for having tension or compression forces applied thereto as a function of the composite proof mass 130 moving relative to the composite frame 132. The one or more vibrating beams 128 are optionally configured as either two-bar or four-bar double-ended tuning forks (DETFs) as are well-known in the art. For example, the DETFs 128 are four-bar DETFs of the type described in incorporated U.S. Pat. No. 5,501,103 with the outer pairs being mechanically coupled by respective cross members 134, 136 that cause these beam pairs to vibrate together.

In practice, each individual composite device 108a–108n is provided with means for vibrating the one or more DETFs 128 at their respective resonant frequency when the composite proof mass 130 is at rest. For example, electrical conductors are provided on the beams of the DETFs 128 and electrically interconnected to an oscillator circuit of the type described herein is provided interact with a magnetic field to drive the outer set of vibrating beams. The driven outer set of vibrating beams in turn drive the inner set of vibrating beams. An output or pickoff voltage is generated across the inner set of beams, which is then applied to an amplifier by way of a positive feedback loop in order to form the oscillator.

Figure 5:
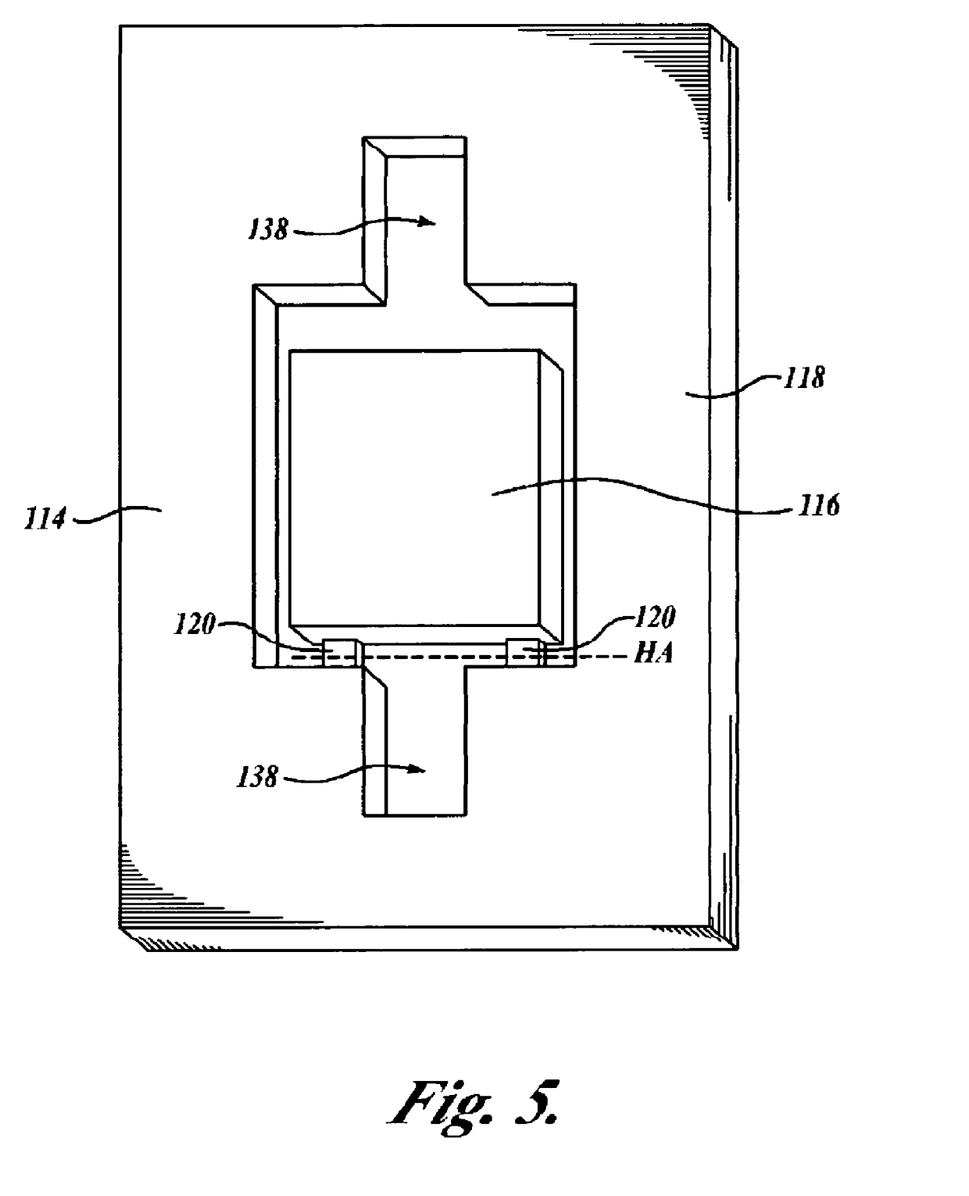
FIG. 5 illustrates a first portion of the method of the invention embodied in an exemplary first substrate having both partial and complete stand-alone 3-dimensional features formed therein.

FIG. 5 shows the first portion of the method of the invention embodied in a the first substrate 114 of the exemplary composite device 108a that includes the first partial proof mass 116 connected to the first partial frame 118 by the one or more flexures 120 for translation or rotation about the hinge axis HA. Each first substrate 114 also includes a cooperating relief area 138 positioned to provide operating space for each of the one or more vibrating beams 128 provided in the second substrate 122. As discussed above, an array of such first substrates 114 is micromachined in one of the pair of silicon wafers 102, 104 shown in FIG. 3 as 3-dimensional device features 106 and form one part of the composite MEMS accelerometer devices 108a–108n.

Figure 6:
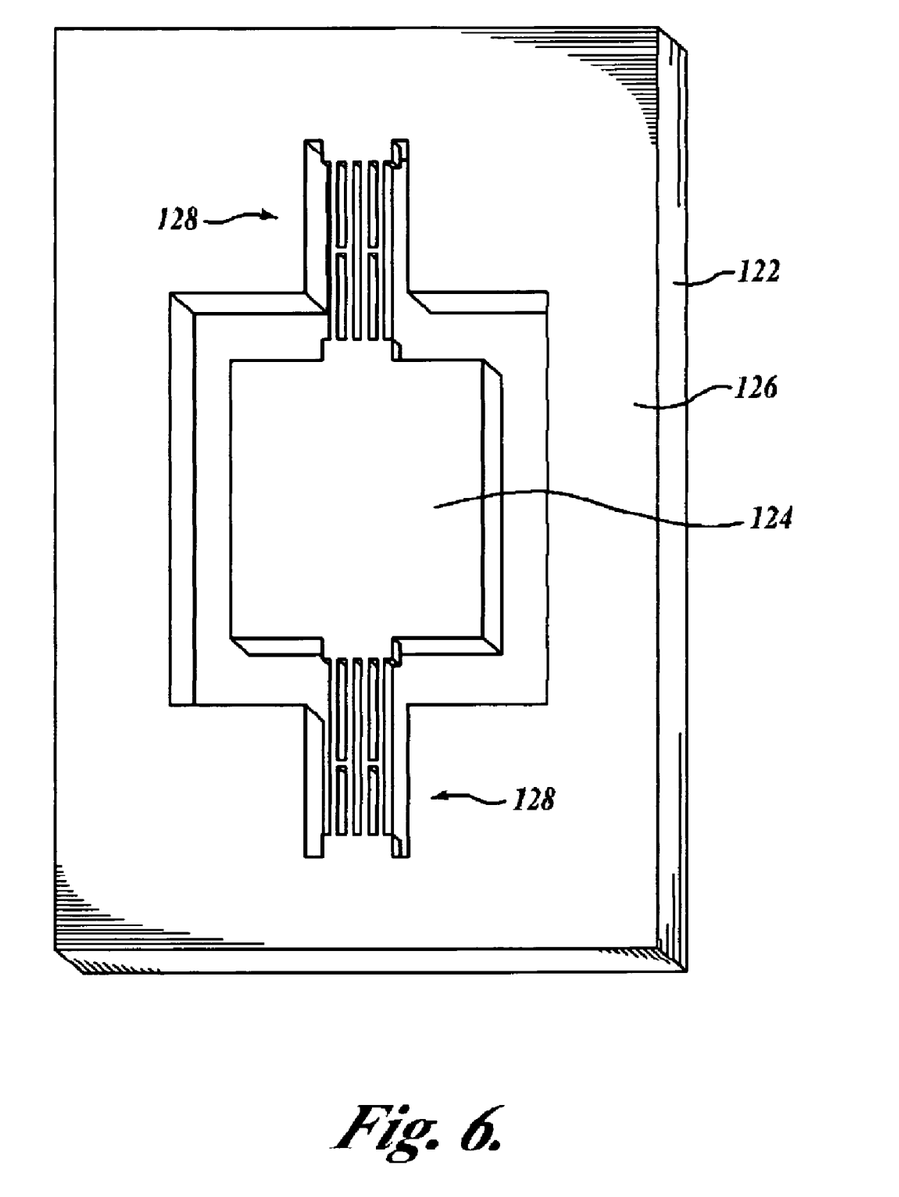
FIG. 6 illustrates a second portion of the method of the invention embodied in an exemplary second substrate having both partial and complete stand-alone 3-dimensional features formed therein, the partial and complete 3-dimensional features being configured and arranged to cooperate with those of the first substrate illustrated in FIG. 5 to form composite and independent cooperating 3-dimensional features in a composite MEMS device.

FIG. 6 shows the first portion of the method of the invention embodied in a the second substrate 122 of the exemplary composite device 108a that includes the second partial proof mass 124 connected to the second partial frame 126 by the one or more vibrating beams 128. As discussed above, an array of such second substrates 122 is micromachined in a different one of the pair of silicon wafers 102, 104 shown in FIG. 3 as 3-dimensional device features 106 and form a second part of the composite MEMS accelerometer devices 108a–108n. The array of second partial proof masses 124 and second partial frames 126 are arranged to mate with the array of first partial proof masses 116 and first partial frames 118 to form an array of the composite proof masses 130 and frames 132 shown in FIG. 4. Similarly, the array of vibrating beams 128 is arranged to mate with the array of cooperating relief area 138 formed in the first substrates 114 such that during operation the vibrating beams 128 have sufficient space in which to operate.

While the preferred embodiment of the invention has been illustrated and described, it will be appreciated that various changes can be made therein without departing from the spirit and scope of the invention.

What is claimed is:

1. A composite microelectromechanical system (MEMS) integrated micro acceleration sensor, comprising a substrate having formed therein a proof mass suspended from a frame by a flexure and a vibratory beam coupled between the proof mass and the frame, wherein:
    at least one of the proof mass and the frame further comprises a composite of two or more substrates, and
    at least one of the flexure and the vibratory beam is formed complete in a single one of the two or more substrates.

2. The acceleration sensor of claim 1 wherein the flexure is formed complete in a single one of the two or more substrates.

3. The acceleration sensor of claim 1 wherein the vibratory beam is formed complete in a single one of the two or more substrates.

4. The acceleration sensor of claim 1 wherein the flexure is formed complete in a single one of the two or more substrates, and the vibratory beam is formed complete in a different single one of the two or more substrates.

5. The acceleration sensor of claim 4 wherein both the proof mass and the frame further comprises a composite of two or more substrates.

6. The acceleration sensor of claim 5, further comprising means for causing the vibratory beam to vibrate at a resonant frequency when the composite proof mass is at rest relative to the composite frame.

7. A composite microelectromechanical system (MEMS) integrated micro acceleration sensor, comprising:
    first and second substrates each formed of a silicon material and having top and bottom substantially parallel surfaces spaced apart by the thickness of the silicon substrate material;
    a continuous composite proof mass partially formed in each of the first and second substrates and permanently joined together;
    a continuous composite frame partially formed in each of the first and second substrates and permanently joined together;
    a flexure suspending the composite proof mass for movement relative to the composite frame;
    a vibratory beam coupled between the composite proof mass and the composite frame;
    electrical means for vibrating the vibratory beam at a resonant frequency when the composite proof mass is at rest relative to the composite frame; and
    electrical means for receiving a signal representative of a variation in the resonant frequency of the vibrating beam as a function of tension or compression forces being applied by movement of the composite proof mass relative to the composite frame.

8. The acceleration sensor of claim 7 wherein the flexure suspending the composite proof mass from the composite frame further comprises a flexure being completely formed in one of the first and second substrates integrally with one portion of the composite proof mass and integral with one portion of the composite frame.

9. The acceleration sensor of claim 7 wherein the vibratory beam coupled between the composite proof mass and the composite frame further comprises a vibratory beam being completely formed in one of the first and second substrates integrally with one portion of the composite proof mass and integral with one portion of the composite frame.

10. A composite microelectromechanical system (MEMS) integrated micro acceleration sensor comprising:
   a proof mass suspended by a flexure from a frame, wherein:
      the proof mass further comprises a continuous composite of two partial proof masses each formed in different first and second substrates,
      the frame further comprises a continuous composite of two partial frame each formed in the different first and second substrates, and
      the flexure is formed complete in a single one of the first and second substrates; and
   a vibratory beam coupled between the proof mass and the frame.

11. The acceleration sensor of claim 10 wherein the vibratory beam is formed complete in a single one of the first and second substrates.

12. The acceleration sensor of claim 11, further comprising a relief formed in a different one of the first and second substrates and arranged to cooperate with the vibratory beam.

13. The acceleration sensor of claim 11 wherein the flexure and vibratory beam are formed in different ones of the first and the second substrates.

14. The acceleration sensor of claim 10, further comprising means for causing the vibratory beam to vibrate at a resonant frequency.

15. A composite microelectromechanical system (MEMS) integrated sensor comprising:
   first and second silicon substrates permanently fused together in a continuous composite silicon substrate;
   one or more first complete stand-alone three-dimensional micromechanical device features formed in the first silicon substrate;
   one or more second complete stand-alone three-dimensional micromechanical device features formed in the second silicon substrate; and
   one or more composite three-dimensional micromechanical device features formed of first partial three-dimensional micromechanical device features formed in the first silicon substrate that are permanently joined to cooperating second partial three-dimensional micromechanical device features formed in the second silicon substrate.

16. The sensor of claim 15 wherein the composite three-dimensional micromechanical device features further comprise a continuous composite proof mass.

17. The sensor of claim 16 wherein the composite three-dimensional micromechanical device features further comprise a continuous composite frame having the composite proof mass suspended therefrom.

18. The sensor of claim 17 wherein the first complete stand-alone three-dimensional micromechanical device features further comprise a flexure coupled between the composite frame and the composite proof mass.

19. The sensor of claim 18 wherein the second complete stand-alone three-dimensional micromechanical device features further comprise a vibratory beam coupled between the composite frame and the composite proof mass.

20. The sensor of claim 19 wherein the first complete stand-alone three-dimensional micromechanical device features further comprise a relief arranged to provide clearance about the vibratory beam.

* * * * *